United States Patent
Michel et al.

(10) Patent No.: US 10,925,193 B2
(45) Date of Patent: Feb. 16, 2021

(54) CONTROL DEVICE FOR A GEARBOX CONTROL SYSTEM OF A MOTOR VEHICLE

(71) Applicant: Robert Bosch GmbH, Stuttgart (DE)

(72) Inventors: Heiko Michel, Gerlingen (DE);
Gerhard Wetzel, Korntal-Muenchingen (DE); Torsten Berger, Remseck am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/767,414

(22) PCT Filed: Sep. 5, 2016

(86) PCT No.: PCT/EP2016/070859
§ 371 (c)(1),
(2) Date: Apr. 11, 2018

(87) PCT Pub. No.: WO2017/071860
PCT Pub. Date: May 4, 2017

(65) Prior Publication Data
US 2018/0303009 A1 Oct. 18, 2018

(30) Foreign Application Priority Data
Oct. 29, 2015 (DE) .................. 10 2015 221 149.5

(51) Int. Cl.
*H05K 7/20* (2006.01)
*F16H 61/00* (2006.01)
(Continued)

(52) U.S. Cl.
CPC ..... *H05K 7/20854* (2013.01); *F16H 61/0006* (2013.01); *H05K 5/0082* (2013.01);
(Continued)

(58) Field of Classification Search
CPC .............. H05K 7/20854; H05K 7/205; H05K 1/0201–0204
(Continued)

(56) References Cited

U.S. PATENT DOCUMENTS

| 6,924,985 B2 * | 8/2005 | Kawakita | H05K 5/062 257/711 |
| 2002/0047193 A1 * | 4/2002 | Dorfler | H01L 23/367 257/687 |

(Continued)

FOREIGN PATENT DOCUMENTS

| CN | 201805622 U | 4/2011 |
| CN | 204046939 U | 12/2014 |

(Continued)

OTHER PUBLICATIONS

International Search Report corresponding to PCT Application No. PCT/EP2016/070859, dated Nov. 11, 2016 (German and English language document) (7 pages).

*Primary Examiner* — Zachary Pape
(74) *Attorney, Agent, or Firm* — Maginot, Moore & Beck LLP

(57) ABSTRACT

A control device for a gearbox control system of a motor vehicle includes electric components having different high dissipated power, a rigid circuit board which is equipped on both sides with electric components, at least one cooling body on the same side as the circuit board on which the power components are arranged, and a potting compound, which at least partially surrounds the components. The circuit board is secured directly adjacent to the cooling body.

12 Claims, 1 Drawing Sheet

(51) Int. Cl.
  *H05K 5/00* (2006.01)
  *H05K 1/02* (2006.01)
(52) U.S. Cl.
  CPC ........... *H05K 7/205* (2013.01); *H05K 1/0204* (2013.01); *H05K 1/0207* (2013.01); *H05K 7/20463* (2013.01)
(58) Field of Classification Search
  USPC ................. 361/679.46–679.54, 688–723; 165/80.1–80.3
  See application file for complete search history.

(56) References Cited

U.S. PATENT DOCUMENTS

| | | | | |
|---|---|---|---|---|
| 2005/0201069 | A1* | 9/2005 | Kirigaya | H05K 1/0203 361/752 |
| 2008/0019106 | A1* | 1/2008 | Wetzel | F16H 61/0006 361/752 |
| 2008/0266821 | A1* | 10/2008 | Wetzel | H01L 21/50 361/757 |
| 2011/0013365 | A1* | 1/2011 | Oota | B62D 5/0406 361/707 |
| 2011/0044005 | A1* | 2/2011 | Wetzel | H05K 5/0082 361/714 |
| 2012/0069532 | A1* | 3/2012 | Azumi | H05K 5/0052 361/752 |
| 2012/0240396 | A1* | 9/2012 | Becker | H05K 1/18 29/841 |
| 2012/0240898 | A1* | 9/2012 | Lemecha | F02D 9/105 123/350 |
| 2013/0308274 | A1* | 11/2013 | Murdock | H05K 7/205 361/717 |
| 2016/0172267 | A1* | 6/2016 | Maier | H01L 23/36 257/713 |
| 2016/0381817 | A1* | 12/2016 | Ott | H05K 3/284 156/272.8 |

FOREIGN PATENT DOCUMENTS

| | | |
|---|---|---|
| DE | 197 22 357 C1 | 11/1998 |
| DE | 199 10 500 A1 | 10/2000 |
| DE | 101 27 268 A1 | 4/2002 |
| DE | 10 2010 016 279 A1 | 11/2010 |
| DE | 10 2013 212 398 A1 | 12/2014 |
| DE | 10 2013 215 364 A1 | 2/2015 |
| DE | 10 2013 223 542 A1 | 5/2015 |
| DE | 11 2013 004 625 T5 | 6/2015 |
| EP | 1 677 583 A1 | 7/2006 |
| EP | 1 732 131 A2 | 12/2006 |

* cited by examiner

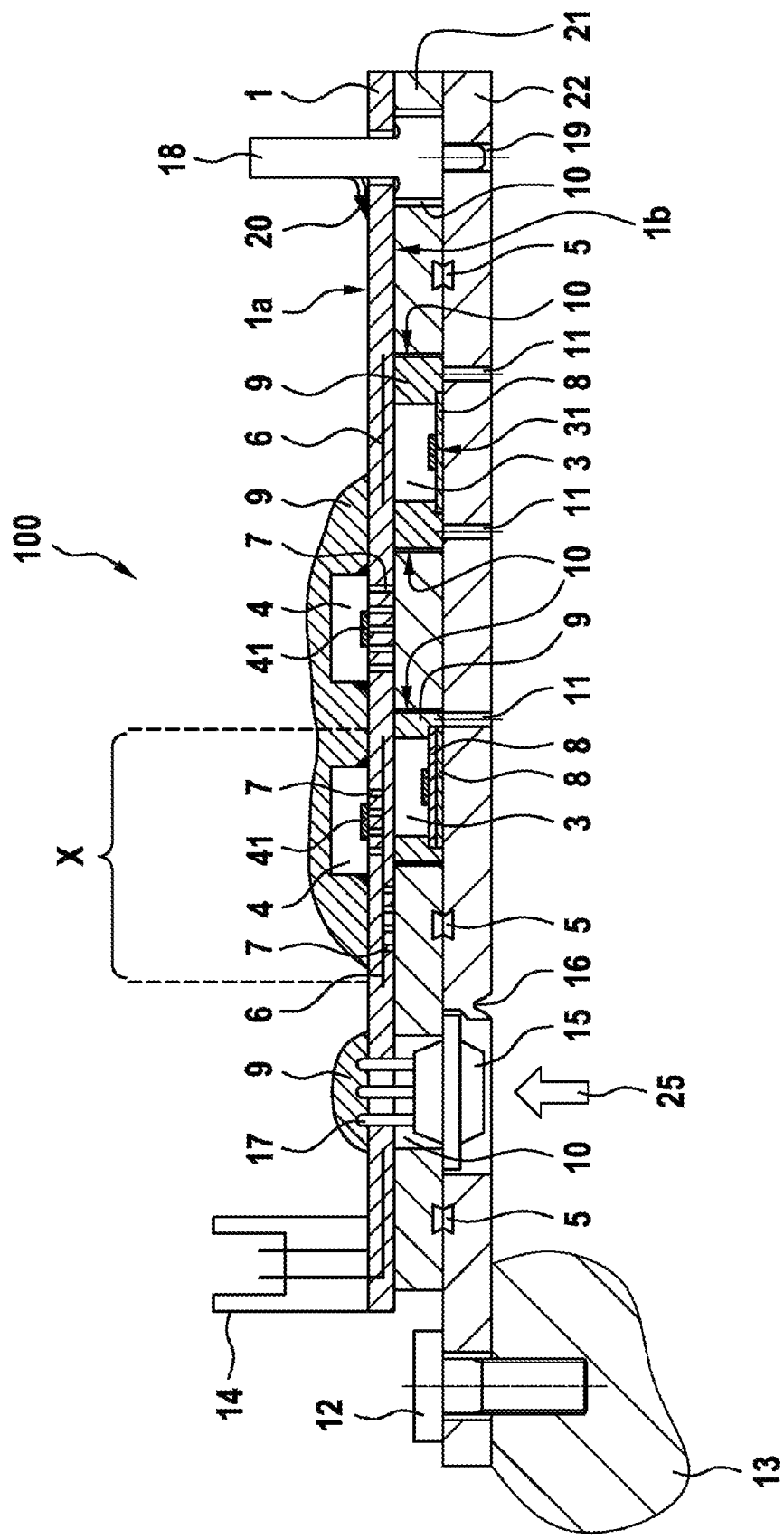

CONTROL DEVICE FOR A GEARBOX CONTROL SYSTEM OF A MOTOR VEHICLE

This application is a 35 U.S.C. § 371 National Stage Application of PCT/EP2016/070859, filed on Sep. 5, 2016, which claims the benefit of priority to Serial No. DE 10 2015 221 149.5, filed on Oct. 29, 2015 in Germany, the disclosures of which are incorporated herein by reference in their entirety.

BACKGROUND

The disclosure concerns a control device for a gearbox control system of a motor vehicle.

It is known to dispose control devices for gearboxes within gearboxes. In this case, the control devices are in contact with a gearbox oil. Nowadays, the control devices for gearbox control systems, in particular in automatic gearboxes, control not only solenoid valves for hydraulic control, but also oil pumps driven by electric motors, here in particular to implement start-stop functions. In this case, the necessary power components in the control device produce a large power loss that is dissipated by means of thermal dissipaters.

It is known nowadays to use circuit boards, printed circuit boards, PCBs, in the interior of a gearbox instead of the previously customary expensive ceramic substrate of $Al_2O_3$, LTCC.

In order to build control devices as compactly as possible, it is known to populate the circuit boards on both sides.

DE 10 2013 215 364 describes an electronic circuit module with components disposed on a circuit board on both sides, wherein at least one cooling body exerts a contact force towards the circuit board and towards an electronic component that is to be cooled and is embodied spaced apart from the circuit board.

SUMMARY

Embodiments of the disclosure can advantageously enable a compact control device for a gearbox control system of a motor vehicle with good thermal dissipation to be provided.

According to a first aspect of the disclosure, a control device for a gearbox control system of a motor vehicle is provided with electrical components with different levels of power loss, a rigid circuit board populated on both sides with electrical components, and with at least one cooling body disposed on the circuit board, wherein the at least one cooling body is disposed on the side on the circuit board on which power components are disposed, and which comprises a potting material that at least partly envelops the components. The control device according to the disclosure is characterized in particular by the circuit board being fastened in direct contact with the cooling body.

Because of the direct contact between the circuit board and the cooling body, extremely effective heat dissipation from the circuit board and the components disposed thereon results. In this case, power components such as are necessary for example for actuating an electric pump have the shortest thermal path with minimal thermal transition.

According to an embodiment forming a development of the disclosure, the power components with a high power loss are disposed on the side on the circuit board on which the at least one cooling body is disposed. Components that produce a smaller power loss are fitted on the opposite side of the circuit board. Thus, the cooling body is used efficiently in the operation of the control device.

In order to cool the components more effectively with the cooling body, further apertures for accepting components in the cooling body are preferably provided.

In order to manufacture the cooling body as economically as possible in large numbers with a high uniform quality, the at least one cooling body is preferably manufactured as a sheet metal stamping, wherein in particular the preferred material is aluminum. As described above, the circuit board is preferably embodied such that it usually adequately withstands working temperatures of for example 150° C.

According to an embodiment that is a development of the disclosure, components with an electrical circuit that are mounted on the upper side of the circuit board opposite the cooling body comprise the electrical circuit on the underside of the component in contact with the circuit board, i.e. slug down, and in particular components with an electrical circuit that are mounted on the underside of the circuit board together with the cooling body comprise the electrical circuit on the upper side of the components in contact with the cooling body, i.e. slug up. Because of the specific use of the particular components, depending on the type of power loss on the circuit board of the control device, the heat dissipation path is thus shortened and the heat dissipation is thus more efficient.

In order to make the heat dissipation more efficient and production more efficient, two cooling bodies are preferably disposed in a stack, wherein in particular the two cooling bodies are manufactured with punch riveting during the manufacturing process. The two stacked cooling plates moreover produce improved flexural stiffness. Moreover, further components can be attached to the circuit board or to the outer cooling body better and more securely by using two cooling plates in apertures and recesses and undercuts and shorten the heat dissipation paths.

According to an embodiment that develops the disclosure, the circuit board is glued onto the cooling body for thermal heat conduction and in particular is mechanically fastened to the cooling body.

So that the heat dissipation from the upper side of the circuit board to at least one cooling body on the underside of the circuit board is achieved effectively, leadthroughs, so-called vias, are formed through the circuit board. In an embodiment that is a development of the disclosure the circuit board comprises at least one thick copper conducting track with in particular a conducting track thickness of 100 µm, wherein in addition to electrically conductive conducting tracks, thermally conductive tracks are embodied to which leadthroughs lead from the upper side of the circuit board and leadthroughs that are offset thereto lead from the underside of the circuit board.

In order to reduce the costs of components and to make the control device as compact as possible, the control device is embodied with an electrical circuit as an integrated module with sensors and analysis and control electronics as active components. The sensors can for example be pressure sensors for hydraulic arrangements or revolution rate sensors. Furthermore, the sensors are preferably clamped onto the control device, in particular disposed between the circuit board and the at least two cooling bodies and fastened. In particular, a further retainer can additionally be disposed on the outer cooling body.

In order to install the control device securely in the gearbox, the control device can be mechanically attached by means of the cooling body to the gearbox housing in the interior of a gearbox. For this purpose, the at least one cooling body, which is spaced apart the furthest from the circuit board, comprises bores, so that the control device can be fastened in the inner gearbox housing by means of a threaded connection for example.

According to an embodiment that is development of the disclosure, a heat-conducting arrangement, in particular a heat-conducting film, more preferably a multilayer heat-conducting film or a heat-conducting film with a greater film thickness, is disposed between the component and the cooling body. Thus, a continuous heat-conducting path for components disposed on the underside of the circuit board is achieved to the outer cooling body that is spaced apart from the circuit board.

It is to be noted that some of the possible features and advantages of the disclosure are described herein with reference to different embodiments. A person skilled in the art will recognize that the features can be combined, adapted or exchanged in a suitable manner to produce further embodiments of the disclosure.

BRIEF DESCRIPTION OF THE DRAWINGS

Embodiments of the disclosure are described below while referring to the accompanying drawing, wherein neither the drawing nor the description are to be considered as limiting the disclosure. In the FIGURE FIG. 1 shows a cross-sectional view of a control device according to the disclosure.

The FIGURE is only shown schematically and is not to scale.

DETAILED DESCRIPTION

FIG. 1 shows in cross-section a control device 100 according to the disclosure for a gearbox control system of a motor vehicle. The control device 100 comprises a rigid circuit board 1, a so-called printed circuit board, PCB. The circuit board 1 is populated on both sides 1a, 1b with electrical components 3, 4, 15, 18. The electrical components 3, 4, 15, 18 comprise different levels of power loss. The components 4 with a small power loss are disposed on the upper side 1a and the components 3, in particular power components, with a high power loss are disposed on the underside 1b of the circuit board 1, on which two cooling bodies 21, 22 are disposed. The components 4 on the upper side 1a of the circuit board 1 are enveloped by means of a potting material 9 and sealed against external influences, for example a transmission oil. Likewise, the conductor ends of the component 17 on the upper side 1a of the circuit board 1 are sealed by means of potting material. The component 15 mounted on the underside 1b of the circuit board 1, the connector tips of which appear on the upper side 1a of the circuit board 1, are also sealed with the potting material 9. According to the disclosure, the circuit board 1 is in direct contact with the cooling body 21. The cooling body 21 comprises apertures 10, in which components 3 and power components and electronic sensors 15, 18 are disposed. Thus, heat-conducting paths and thermal transitions are shortened and minimized. Longer thermal paths and longer thermal transitions are provided for components 4 with a smaller power loss. Power components 3, for example for the actuation of an electrical pump, are disposed on the underside 1b of the circuit board 1.

The cooling body 21 and the second cooling body 22 are both preferably a sheet metal stamping of aluminum and are riveted by means of rivets 5 or clinched. The circuit board 1 is a conventional circuit board that adequately withstands a working temperature of 150° C. and therefore does not have to be manufactured from a ceramic material.

The components 3 with a large power loss that are disposed on the underside 1b of the circuit board 1 are inserted in a so-called slug up embodiment. With said embodiment, the electrical circuit 31 is disposed on the surface of the component 3 spaced apart from the circuit board 1 in the region next to the second cooling body 22. In the case of the particular embodiment shown in FIG. 1, a heat-conducting film 8 between the component 3 and the electrical circuit 31 is shown resting on the cooling body 22 by means of either one layer or two layers. The aperture 10 of the cooling body 21, in which the component 3 is disposed with a heat-conducting film 8, is filled by the potting material 9. The potting material 9 is likewise embodied as heat-conductive and heat-dissipating.

Components 4 with an electrical circuit 41 in a slug down embodiment are disposed on the upper side 1a of the circuit board 1. In the case of said components 4, the electrical circuits 41 are disposed on the underside of the components, so that they are in direct contact with the circuit board 1. In order to dissipate the heat from the electrical circuit 41 here, leadthroughs 7, so-called vias, are formed through the circuit board 1, which carry the heat away from component 4 to the cooling bodies 21 and 22.

In the section X, in the case of the left component 4 shown in FIG. 1, a particular heat conducting structure is realized. Here, not only are electrically conductive tracks associated with a thick layer of copper in the circuit board 1, for example with a thickness of 100 μm, but at least one closed thermally conductive track 6 is provided with the result that leadthroughs 7 are formed that lead from the upper side 1a of the circuit board 1 below the component 4 and the electrical circuit 41 to the copper conducting track 6 disposed in the circuit board 1 and leadthroughs that are offset thereto 7 lead from the copper conducting track 6 to the underside 1b of the circuit board 1. Here the cooling body 21 is in direct contact with the underside 1b, so that here the heat is extracted by the cooling body 21 and the cooling body 22 that is attached thereto. Thus, heat on the component 4 is directly fed out to the cooling body 21, 22 via the copper conducting track 6. Thus, heat is transferred efficiently from the circuit board 1 to the cooling body 21, 22, the circuit board 1 is glued onto the cooling body 21 for a short thermal heat path and is additionally mechanically fastened.

The control device 100 is an integrated module with sensors and active components with an electrical circuit comprising analysis and/or control electronics. The components 3 can have different structural heights. Said height difference is compensated by one or more layers of the heat-conducting film 8 or by a greater film thickness. The components 3 lie on the cooling body 22 directly or indirectly via a heat-conducting film 8. The components 3 therefore have a short thermal transition and a very short heat path.

The potting material 9, which is a plastic material, is applied to the underside of the circuit board 1b by means of bores 11 in the cooling body 22 to the cavities and apertures 10 in which the components 3 are disposed. The control device 100 is fastened in the interior, for example by means of bolts 12 in the interior of a gearbox. Preferably, the control unit is attached to hydraulic circuit boards 13, wherein as a result the power loss introduced into the cooling bodies 21, 22 can be passed on to the large thermal mass of the circuit boards. The circuit board 1 comprises at least one plug connector 14 as a socket or a plug that is contacted by a vehicle cable loom and with which further sensors can also be electrically contacted. The further sensors are revolution rate, position and/or pressure sensors.

As shown in FIG. 1, pressure sensors 15 can also be directly inserted in the cooling body plate 21, 22. Pressure forces 25 represented by the arrow 25 can be borne by the cooling body plate 21. By means of caulking 16, the pressure sensor 15 is additionally in contact with the cooling body 21 and is clamped and mechanically fixed in a positive-fit manner by means of the cooling body 22. The pressure sensor is soldered onto the connecting pins, so-called contact pins, with the circuit board 1 on the upper side 1a.

For example, revolution rate sensors 18 can be clamped between the circuit board 1 and the cooling body plate 22 and accurately positioned by bores 19 in the plate 22. The revolution rate sensors 18 are also electrically conductively soldered to the circuit board 1 by means of soldering points 20 on the upper side 1a. Although only partly shown explicitly in FIG. 1, all contact points of the sensors 15 and 18 and the components 4 are protected by the plastic potting material 9 in relation to ambient influences, such as short-circuits due to metal particles or the formation of conductive deposits. The gearbox oil can contain electrically conductive metals as a result of wear and abrasion that could cause a short circuit. Likewise, it is known that gearbox oil can form conductive deposits in combination with other materials and high temperatures, possibly leading to electrical short circuits. By covering all electrical contact points with the potting material, said negative effects are avoided. Thus, because of the use of a plastic molding as the potting material 9, a housing that is mechanically sealed and can be closed is no longer necessary and can be omitted. This shows how efficient thermal dissipation in a control device 100 is achieved.

Finally, it should be noted that terms such as "having", "comprising", etc. do not exclude any other elements or steps and terms such "a" or "one" do not exclude any numbers. Reference characters in the claims shall not be considered to be limiting.

The invention claimed is:

1. A control device for a gearbox control system of a motor vehicle, comprising:
   a plurality of electrical components including first electrical components and second electrical components, the first electrical components each having a first power loss level that is smaller than a second power loss level of each of the second electrical components;
   a rigid circuit board, first electrical components arranged on a first side of the rigid circuit board and the second electrical components arranged on a second side of the rigid circuit board;
   at least one cooling body disposed on the second side of the rigid circuit board;
   a potting material at least partly enveloping the plurality of electrical components, wherein the rigid circuit board is attached to the at least one cooling body in direct contact; and
   first leadthroughs and second leadthroughs formed through the rigid circuit board, wherein:
   the rigid circuit board includes at least one thick copper conductive track having a 100 μm conductive track thickness;
   additional thermally conductive tracks are formed on the rigid circuit board;
   the first leadthroughs extend from at least one of the at least one thick copper conductive track and the additional thermally conductive tracks to the first side of the rigid circuit board and the second leadthroughs extend from the at least one of the at least one thick copper conductive track and the additional thermally conductive tracks to the second side of the rigid circuit board; and
   the second leadthroughs are offset from the first leadthroughs in a direction parallel to a plane defined by the rigid circuit board.

2. The control device as claimed in claim 1, wherein the at least one cooling body comprises apertures configured to accommodate the second electrical components.

3. The control device as claimed in claim 1, wherein:
   the at least one cooling body is manufactured as a sheet metal stamping; and
   the at least one cooling body is formed of aluminum.

4. The control device as claimed in claim 1, wherein:
   the first electrical components each include a first electrical circuit that is in contact with the rigid circuit board; and
   the second electrical components each include a second electrical circuit that is in contact with the at least one cooling body.

5. The control device as claimed in claim 1, wherein:
   the at least one cooling body includes two cooling bodies disposed in a stack; and
   the two cooling bodies are riveted together with rivets.

6. The control device as claimed in claim 1, wherein:
   the rigid circuit board is glued onto the at least one cooling body for thermal heat conduction; and
   the rigid circuit board is mechanically attached to the at least one cooling body.

7. The control device as claimed in claim 1, wherein the control device is embodied as an integrated module including the plurality of electrical components, the plurality of electrical components having a plurality of sensors and analysis and control electronics.

8. The control device as claimed in claim 7, wherein at least one electrical component of the plurality of electrical components is clamped between and attached to the rigid circuit board and the at least one cooling body.

9. The control device as claimed in claim 1, wherein the control device is mechanically attached to the gearbox housing or a circuit board in an interior of the gearbox housing by the at least one cooling body.

10. The control device as claimed in claim 1, further comprising:
    a heat conducting arrangement including a multilayer heat-conducting film or a heat-conducting film with a thicker layer,
    wherein the heat conducting arrangement is disposed between at least one of the plurality of electrical components and the at least one cooling body.

11. The control device as claimed in claim 1, wherein the second electrical components are power components.

12. A control device for a gearbox control system of a motor vehicle comprising:
    a plurality of electrical components including first electrical components and second electrical components, the first electrical components each having a first power loss level that is smaller than a second power loss level of each of the second electrical components;
    a rigid circuit board, the first electrical components arranged on a first side of the rigid circuit board and the second electrical components arranged on a second side of the rigid circuit board;
    at least one cooling body disposed on the second side of the rigid circuit board; and a potting material at least partly enveloping the plurality of electrical components, wherein the rigid circuit board is attached to the at least one cooling body in direct contact, wherein:

the control device is embodied as an integrated module including the plurality of electrical components, the plurality of electrical components having a plurality of sensors and analysis and control electronics;

at least one electrical component of the plurality of electrical components is clamped between and attached to the rigid circuit board and the at least one cooling body;

the at least one electrical component of the plurality of electrical components is a sensor;

the at least one cooling body includes a first cooling body and a second cooling body;

the first cooling body is located between the rigid circuit board and the second cooling body; and the sensor is clamped by the rigid circuit board and the second cooling body.

\* \* \* \* \*